United States Patent [19]

Dick

[11] Patent Number: 5,307,031
[45] Date of Patent: Apr. 26, 1994

[54] STANDARD OR REFERENCE TRANSMISSION LINE WITH VARIABLE GROUP TIME DELAY

[75] Inventor: Rudolf Dick, Eningen, Fed. Rep. of Germany

[73] Assignee: Wandel & Goltermann GmbH & Co. Elektronische Messtechnik, Eningen, Fed. Rep. of Germany

[21] Appl. No.: 939,487

[22] Filed: Sep. 2, 1992

[30] Foreign Application Priority Data

Sep. 4, 1991 [DE] Fed. Rep. of Germany ....... 4129353

[51] Int. Cl.$^5$ .......................... H03H 7/18; H01P 9/00
[52] U.S. Cl. ................................ 333/28 R; 333/156; 333/160
[58] Field of Search ............... 333/28 R, 28 T, 138, 333/139, 140, 156, 159, 160, 164

[56] References Cited

U.S. PATENT DOCUMENTS

| | | | |
|---|---|---|---|
| 3,206,686 | 9/1965 | Goor | 333/139 X |
| 3,781,722 | 12/1973 | Pierson | 333/156 |
| 4,056,792 | 11/1977 | Horwitz et al. | 333/156 |
| 4,594,561 | 6/1986 | Grodrosky et al. | 330/297 |

FOREIGN PATENT DOCUMENTS

| | | | |
|---|---|---|---|
| 0223316 | 11/1985 | Japan | 333/139 |
| 0201603 | 9/1991 | Japan | 333/139 |

OTHER PUBLICATIONS

IFC Publication 835, Part 2, Measurements for Terrestrial Radio-Relay Systems, Mar. 1990, pp. 6, 7, 19.
Patent Abstracts of Japan, vol. 12, No. 94, Mar. 26, 1988; JP-A-62-226708, Tanaka, Oct. 5, 1987.

*Primary Examiner*—Seungsook Ham
*Attorney, Agent, or Firm*—Herbert Dubno

[57] ABSTRACT

An adjustable impedance-correcting delay line adapted to form a standard line for providing an adjustable group delay time for measurement purposes or the like in which a plurality of different delay networks including coaxial segments of different lengths with or without damping compensating amplifiers can be selectively connected in the cascade or shunted. A bridge circuit can be provided with fundamental damping and delay time for bridging with the standard delay line where difference measurements are of interest.

8 Claims, 1 Drawing Sheet

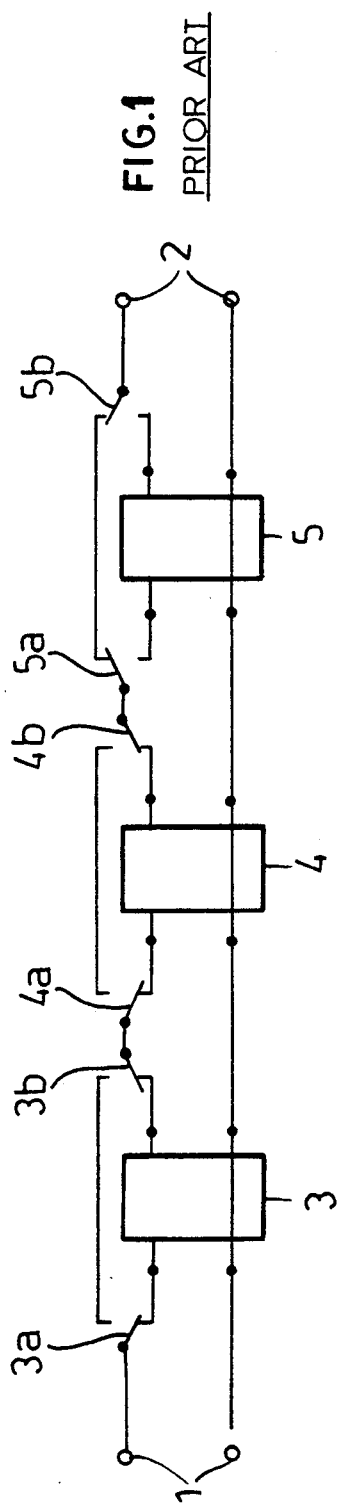
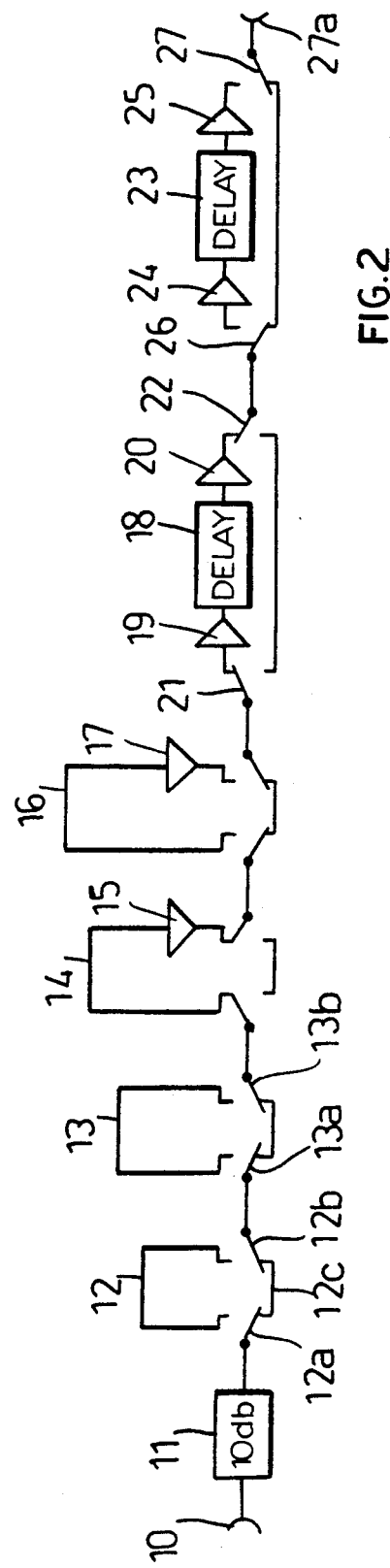
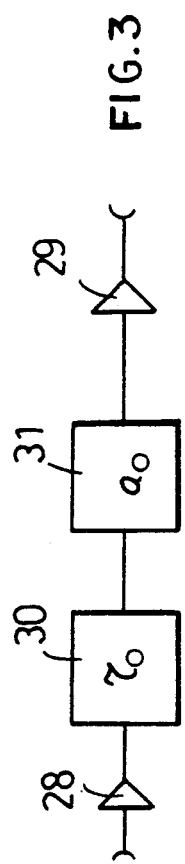

5,307,031

STANDARD OR REFERENCE TRANSMISSION LINE WITH VARIABLE GROUP TIME DELAY

FIELD OF THE INVENTION

The present invention relates to an adjustable, characteristic-impedance-correcting delay line capable of use as a standard or reference transmission line for establishing a group delay time which is adjustable in steps over a wide range. More particularly, the invention relates to an adjustable delay line having a cascade of individual time delay networks with shunts enabling these networks to be bridged selectively to thereby provide in the delay line both an impedance matching characteristic and an adjustable time delay for the packets of pulses sent along the transmission line.

BACKGROUND OF THE INVENTION

Colby Instruments, Inc. provides characteristic--impedance-correcting standard or reference lines capable of realizing adjustable delays (group time delays or delay times) as delay lines PDL 10A, PDL 20A. Within a fairly narrow range of values, the delay times can be selected arbitrarily.

These known delay lines work exclusively with coaxial lines which can be extended or contracted and of the so-called variable length or telescoping line ("trombone") type or with coaxial relays. The fabrication and adjustment of such systems is extraordinarily expensive and the damping is frequency-dependent.

For diversity systems in radio relay or microwave technology, delay time differences have had to be tolerable (see IFC Publication 835, Part 2, Section 7, FIG. 2) and delay was provided by manually adjustable coaxial cable sections which were introduced in the measuring system at lengths corresponding to the desired group time delay. Here, however, as in the previously described system, apart from the desired group time delay, there was an accompanying undesired frequency dependence of the damping. Such systems are also costly and the use of the system is time-consuming.

OBJECTS OF THE INVENTION

It is, therefore, the principal object of the present invention to provide a standard or reference line, especially in radio relay or microwave systems, for realizing a selected group time delay and which is of simple construction and less costly than earlier systems and which also manifests a negligible frequency dependence of damping Still another object of the invention is to provide a transmission or delay line for the purposes described which will be free from the drawbacks of earlier systems as mentioned above.

SUMMARY OF THE INVENTION

The invention is an adjustable, characteristic-impedance--correcting delay line capable of use as a standard or reference transmission line for establishing a group delay time adjustable in steps over a wide range, especially for measuring systems, the line comprising:
 a multiplicity of selectively effective delay---generating networks having different group delay time and connected in a cascade; and
 a shunt across each of the networks for individually and selectively bridging same, thereby decoupling a selected one of the networks from the cascade.

In this manner it is possible to provide in a branch of the measuring circuit by simple switching a selected, optional group delay time.

It is advantageous, according to the invention, for the components of the standard transmission line which provide a relatively large group delay time, to be constituted as all-pass networks. Furthermore, the elements or components of the standard line which contribute a reduced or relatively small delay time can be formed as short coaxial cable segments.

In the latter case, it can be advantageous for individual components of the standard line to be provided with attenuation equalization or compensation.

In order to compensate or equalize group delay times with the standard transmission line in difference or differential measurements, it has been found to be advantageous to provide a comparator branch which can be connected in a bridge circuit with the cascade and which comprises delay components providing a fundamental group delay time.

With the circuitry of the invention, the group delay time can be selected arbitrarily within a wide range in an especially simple manner, with the adjustment being effected quickly and so that the group delay time is frequency independent.

BRIEF DESCRIPTION OF THE DRAWING

The above and other objects, features and advantages of the present invention will become more readily apparent from the following description, reference being made to the accompanying drawing in which:

FIG. 1 is a block diagram showing principles of the standard transmission line of a prior art system;

FIG. 2 is a schematic or circuit diagram, partially in block form of the standard or reference transmission line of the invention; and FIG. 3 is a block diagram of a circuit providing the fundamental group delay time which can be used in a difference-measuring system in conjunction with the circuit of FIG. 2 by being connected across it in a bridge circuit or substituted for it where a detector circuit is responsive to the difference.

DESCRIPTION OF THE PREFERRED EMBODIMENT

FIG. 1 shows a prior art standard line having input terminals 1 and output terminals 2 and which can be used in conjunction with a measurement system for providing a standardized time delay between the input and output terminals.

The circuit components here consist of three quadrupoles, i.e. two-port, four-terminal delay networks 3, 4, 5 which provide different group delay times or dampings These components or networks 3, 4, 5 can be selectively connected in cascade, i.e. in series, or bridged or shunted by two switches each 3a, 3b or 4a, 4b or 5a, 5b.

In practice, the line can have more than three delay networks which can be diminished in accordance with a weighted set of values.

With the standard transmission line of the invention shown in FIG. 2, a multiplicity of different networks are provided in the cascade and only one network of each type has been illustrated The switches which are used are represented at 12a, 12b, 13a, 13b, etc. and can correspond to the switches described in connection with FIG. 1, capable of shunting the particular network or connecting in the cascade as required.

A first component 11 connected to the input terminal 10, is not switchable and generates a frequency-independent fundamental damping. The further components or networks are switchable into and out of the cascade. In the condition in which they are switched out of the cascade, i.e. are decoupled, they are shunted. The shunt for network 12, for example, is represented at 12c.

The second network 12 can be comprised of short coaxial line segments with a low group-delay time and its damping is negligibly small. A third network 13 can comprise a somewhat longer coaxial line which has a greater group delay time and still a negligible damping.

A fourth network of the cascade comprises a still longer coaxial line 14 which has still a greater group delay time but for which the damping may no longer be negligible. At an input or output side or both, this network is provided with a damping compensating amplifier 15 with its impendance matched to the coaxial lines 3 and 16 which can be connected in cascade therewith.

A fifth network 16 can be constituted of a still longer coaxial line with a still greater group-delay time. Here too the damping is no longer negligible and the frequency dependence of the damping may also not be negligible.

For compensation of the damping, therefore, an attenuation compensating amplifier 17 is provided which is matched to the impedance at the input and output sides of this network.

A sixth network in the circuit can comprise an all-pass network 18 formed from discrete circuit elements and provided between two decoupling amplifiers 19 and 20 for compensating for the fundamental damping of the all-pass circuit Switches 21 and 22 are provided at the input and output sides to allow the sixth network to be connected in the circuit or shunted optionally A seventh network, also composed of discrete circuit elements, is formed by the all-pass circuit 23 which has a still greater group-delay time than the sixth network and for which damping and frequency dependence of the damping may not be tolerable. Here too decoupling amplifiers 24 and 25 are provided for compensation of the damping and are matched at input and output sides to the impedance of the coaxial lines. The seventh network likewise can be switched into the cascade or shunted by switches 26 and 27 and can feed the output terminal 27a of the standard transmission line.

FIG. 3 shows a separate comparative branch which can be connected across the standard line of FIG. 2 or in parallel therewith for difference measurements. It comprises two decoupling amplifiers 28, 29, a delay circuit 30 forming a fundamental delay time corresponding to that of the standard cascade and a damping standard 31 establishing the fundamental damping for the network.

The standard line of the invention can be used to monitor and test delay-time measurement devices and any measurements of diversity system or cross-polarization systems where tolerable delay time differences are of significance.

I claim:

1. An adjustable, characteristic-impedance-correcting delay line capable of use as a standard or reference transmission line for establishing a group delay time adjustable in steps over a wide range, said line comprising:

a multiplicity of selectively effective delay-generating networks having different group delay time and connected in a cascade; and a shunt across each of said networks of individually and selectively bridging same, thereby decoupling selected ones of said networks from said cascade, at least one of said networks being a reference-line impedance matching all-pass network, others of said networks being formed by different lengths of coaxial cable.

2. The delay line defined in claim 1 wherein each of said networks is a two-port, four-terminal delay network.

3. The delay line defined in claim 1 wherein at least some of said networks are decoupled from one another.

4. The delay line defined in claim 1 wherein each of said networks has an input and an output and, at least at one of said networks, a decoupling amplifier is provided at at least one of the input and output thereof.

5. The delay line defined in claim 1 wherein each of said networks has an input and an output and, at least at one of said networks, an equalizing amplifier is provided at at least one of the input and output thereof.

6. The delay line defined in claim 1 wherein at least one of said networks with a relatively small group delay time is formed by short section of cable.

7. The delay line defined in claim 1 wherein a least one of said networks is provided with attenuation equalization.

8. The delay line defined in claim 1 wherein the group time delays of said network are determined in accordance with a weighting set of values.

* * * * *